United States Patent
Goldman (10) Patent No.: US 7,177,611 B2
(45) Date of Patent: Feb. 13, 2007

(54) HYBRID CONTROL OF PHASE LOCKED LOOPS

(75) Inventor: Stanley Jay Goldman, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 330 days.

(21) Appl. No.: 10/885,909

(22) Filed: Jul. 7, 2004

(65) Prior Publication Data

US 2006/0009184 A1    Jan. 12, 2006

(51) Int. Cl.
*H04B 7/00* (2006.01)
*H03L 7/00* (2006.01)
*H03D 3/24* (2006.01)

(52) U.S. Cl. .................. 455/260; 455/264; 455/76; 331/17; 375/376

(58) Field of Classification Search .................. 455/75, 455/76, 165.1, 169.1, 255, 260, 264; 331/17, 331/177 R; 375/376
See application file for complete search history.

(56) References Cited

U.S. PATENT DOCUMENTS

| | | | |
|---|---|---|---|
| 5,487,186 A * | 1/1996 | Scarpa .................... | 455/192.2 |
| 5,495,512 A * | 2/1996 | Kovacs et al. ............. | 375/376 |
| 6,380,810 B1 * | 4/2002 | Sutton ......................... | 331/17 |
| 6,404,291 B1 * | 6/2002 | Riley ........................... | 331/11 |
| 6,407,641 B1 * | 6/2002 | Williams et al. ............ | 331/1 A |
| 6,597,249 B2 * | 7/2003 | Chien et al. ............. | 331/177 R |
| 6,639,476 B1 * | 10/2003 | Sullivan ...................... | 331/17 |
| 2004/0000936 A1 * | 1/2004 | McCollum et al. ......... | 327/156 |

* cited by examiner

*Primary Examiner*—Duc M. Nguyen
(74) *Attorney, Agent, or Firm*—J. Dennis Moore; W. James Brady; Frederick J. Telecky, Jr.

(57) ABSTRACT

A hybrid digital and analog phase locked loop. A voltage controlled oscillator is provided, having a fine tune input, a coarse tune input and an output. A frequency divider has an input connected to receive a signal provided by the output of the voltage controlled oscillator, and has an output for providing a signal having a frequency that is divided with respect to a signal provided to its input. A phase detector is connected to receive a reference input signal having a reference frequency at a first input thereof and is connected to receive the signal provided by the output of the frequency divider. The phase detector has an output for providing a phase error signal. An analog is circuit configured as a proportional filter and is connected to receive the phase error signal and to provide a fine tune signal at the fine tune input of the voltage controlled oscillator. A digital integrator is connected to receive the phase error signal and to provide a coarse tune signal at the coarse tune input of the voltage controlled oscillator.

4 Claims, 9 Drawing Sheets

HYBRID CONTROL OF PHASE LOCKED LOOPS

TECHNICAL FIELD OF THE INVENTION

This invention relates to phase locked loop circuits, and more particularly relates to apparatus and methods for controlling such circuits.

BACKGROUND OF THE INVENTION

Figure 1:
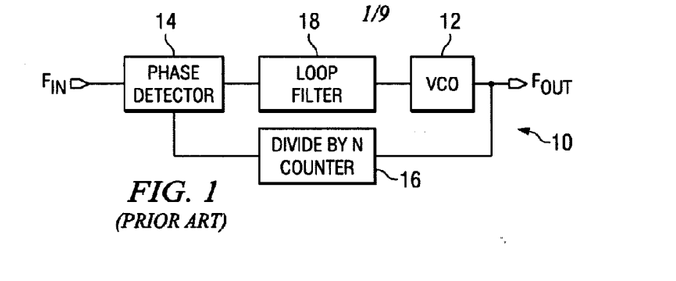
FIG. 1 is a block diagram of a prior art analog PLL.

The phase locked loop (PLL) is a basic component of radio, telecommunication and wireless technologies. PLLs are used for frequency control in a wide variety of applications, and, for example, can be configured as frequency multipliers, tracking generators, demodulators or clock recovery circuits. FIG. 1 is a block diagram showing a basic analog PLL, configured as a frequency multiplier. As can be seen, it is basically a feedback control system that controls a voltage controlled oscillator (VCO) 12. An AC signal having a reference frequency $F_{in}$ is provided to one input of a phase detector 14. The other input of the phase detector 14 is taken from the output of a divide by N counter 16. The output of the phase detector 14 is typically a varying DC signal having a voltage that is proportional to the phase difference between the two inputs. This signal is provided to a loop filter 18 which determines certain dynamic characteristics of the PLL. The filtered signal is applied to the input of the VCO 12, and controls its phase. The output of the VCO 12 is provided as the output signal of the PLL, and is also provided to the input of the divide by N counter 16 as a feedback signal. During normal operation, the PLL controls the frequency $F_{out}$ of the output signal to be N times $F_{in}$, the frequency multiplication occurring as a result of the operation of the divide by N counter 16.

The loop filter 18 is typically designed to provide the characteristics required for the application of the PLL. For example, if the PLL is intended to acquire and track a signal, the loop filter is usually designed to provide a greater bandwidth than if it were intended to be used in an application in which the input frequency is known to be within a narrow range. Other factors bear on the decision of what bandwidth to select for a given application of a PLL. For example, low loop bandwidths typically require that the PLL include a large, external compensation capacitor, which can be in the range of 0.01–1 μF. Such a large capacitor provided externally adds cost to a design. In addition, PLLs in wireless phones are constantly being powered down and back up to save power. It can take a PLL having a large external compensation capacitor up to 10 ms to power up, which is not acceptable to many wireless phone manufacturers.

However, CODECs for wireless phones with multiple formats, such as GSM, TDMA, CDMA, etc., must be capable of acquiring and tracking multiple input reference frequencies, with low noise characteristics, to properly decode and process the transmitted information. The multitude of frequencies requires that the common divisor reference frequency be low, which requires that the loop bandwidth be low, typically 0.1 times the reference frequency. This creates the possibility that an undesirable, large external compensation capacitor be used.

Figure 2:
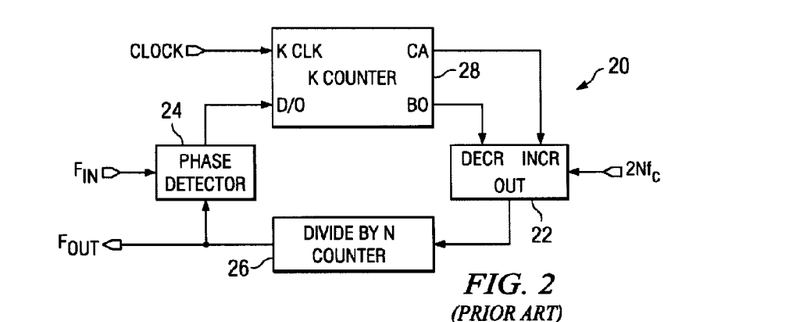
FIG. 2 is a block diagram of a prior art digital PLL.

One prior art approach to meeting low bandwidth requirements, while avoiding the external compensation capacitor, is the all digital PLL (ADPLL). In the ADPLL, all functional blocks are implemented by entirely digital circuits. A large number of digital blocks can be used to implement an all digital PLL. Typically, an ADPLL requires two external clocks. FIG. 2 shows an example of one arrangement of digital blocks forming an ADPLL 20. A digital phase detector 24 receives an AC signal having a reference frequency $f_{in}$ at one input. Phase detector 24 can be implemented, for example, as an exclusive OR (XOR) gate. The other input of the phase detector 24 is taken from the output of a divide by N counter 26, which is the output of the ADPLL and has a frequency $f_{out}$. Phase detector 24 compares the phase of the incoming signal with the phase of the output signal, and outputs an error signal having a frequency proportional to the phase difference, i.e., $f_{in} - f_{out}$. The output of the phase detector 24 is provided to a down/not-up (D/Ū) input of a K-counter 28. K-counter 28 also receives a clock signal CLK at a clock input, and outputs a carry signal at a CA output and a borrow signal at a BO output. K-counter 28 consists of an up-counter and a down-counter, with respective carry and borrow outputs. The D/Ū input to K-counter 28 controls which half of the counter (up or down) is in operation. The carry and borrow outputs of K-counter 28 are connected to respective increment and decrement inputs to an increment/decrement (I/D) circuit 22. The I/D circuit 22 also has as an input a reference clock signal at a frequency $2Nf_c$, where $f_c$ is the free running frequency of the ADPLL when no input is applied. The I/D circuit 22 produces an output signal at a frequency of half of the reference clock signal when no increment or decrement is in progress. A pulse to the decrement input of I/D circuit 22 causes one half-cycle to be deleted from the I/D circuit 22 output, while a pulse to the increment input results in a half cycle being added to that output. The output of the I/D circuit 22 is provided to the input of the divide by N counter 26.

In operation, when the inputs to the phase detector 24 are such that its output is low, then the up-counter of the K-counter 28 operates, eventually producing a carry pulse. The carry pulse is provided to the increment input of I/D circuit 22, causing one half cycle to be added to the output of I/D circuit 22. On the other hand, when the output of phase detector 24 is high, then the down-counter of the K-counter 28 operates, eventually producing a borrow pulse. The borrow pulse is provided to the decrement input of I/D circuit 22, causing one half cycle to be deleted from the output of I/D circuit 22. This continues, so that in a lock state, a specific phase difference is maintained between $f_{in}$ and $f_{out}$. By selecting a high modulus K for the K-counter 28, a low bandwidth can be provided.

As can be seen from the above example, using an ADPLL eliminates the external compensation capacitor. However, ADPLLs have high noise and jitter characteristics. In addition, intermittent glitches can occur in ADPLLs because of quantization and race conditions due to delays that add and subtract at different output frequencies.

Figure 3:
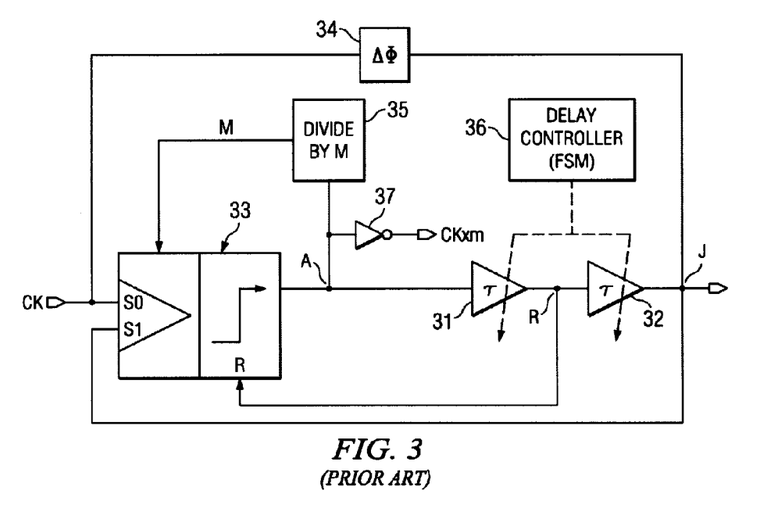
FIG. 3 is a block diagram of a prior art hybrid analog/digital PLL.
Figure 4:
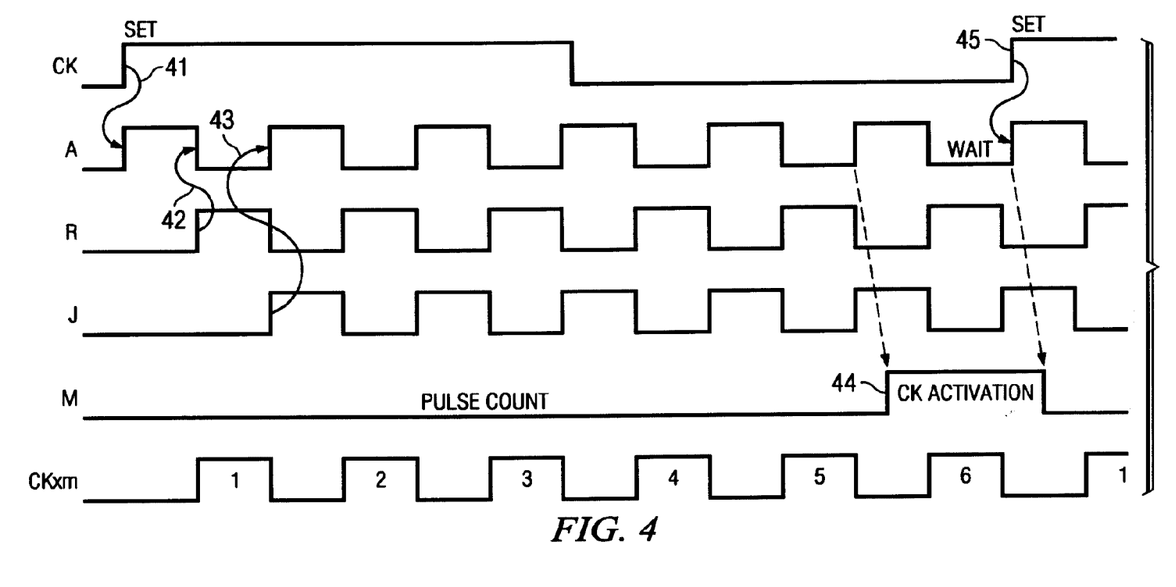
FIG. 4 is a graphic diagram of six signals of the PLL of FIG. 3, vertically aligned in time relationship.

Another prior art approach to meeting low bandwidth requirements, while avoiding the external compensation capacitor, is a hybrid analog/digital phase locked loop (DPLL) using a variable delay line. FIG. 3 shows such a DPLL circuit 30. The circuit includes a first variable delay 31, a second variable delay 32, a set-reset flip-flop 33, a ΔΣ phase comparator 34, a frequency divider (by m) 35 and a delay controller 36 which is a finite state machine. The output signal CK×m is taken from the output of inverter 37 which has its input taken from the output of frequency divider 35. The input clock signal CK, output signal CK×m, and signals at nodes A, R, J and M of FIG. 3 are shown in FIG. 4. To aid in understanding, in FIG. 4 is arbitrarily set at the value six; in practice it can vary widely, depending on the application.

Referring now to FIGS. 3 and 4, in operation, a rising transition on CK at the set 0 input of flip-flop 33 creates a "set" condition for flip-flop 33, resulting in a rising edge at node A, as shown at 41 in FIG. 4. This transition propagates through variable delay 31 and variable delay 32, each of which is set to a delay of duration τ. Since node R is connected to the reset input of flip-flop 33, after a delay of τ after the rising transition on CK flip-flop 33 is reset, causing the signal at node A to fall to a low level, as shown at 42 in FIG. 4. At a time τ after that, the rising edge at node J at the set 1 input of flip-flop 33 creates another "set" condition for flip-flop 33, resulting in another rising edge at node A, as shown at 43 in FIG. 4. These events recur during m cycles, which are counted by the frequency divider 35. When node M goes high (44 in FIG. 4) the s0 input of the multiplexer at the input of flip-flop 33 is selected, resulting in the circuit selecting the external signal CK. At the mth cycle, the phase comparator 34 measures the displacement between the rising edge of CK 45 and the signal on node J 46. A signal corresponding to this measured displacement is provided to the delay controller 36, which adjusts the values of the delay τ so as to maintain lock. The arrangement shown in FIG. 3 has a quantization error of two least significant bits (LSBs).

The range of variation in the delay τ in the arrangement of FIG. 3 is sufficiently wide to allow the circuit to work between the maximum frequency, fmax, and fmax/2. To reduce the output frequency even further, a frequency divider can be added. An independent finite state machine may be provided to compare successive results of phase comparison to indicate whether or not the loop is locked.

Figure 5:
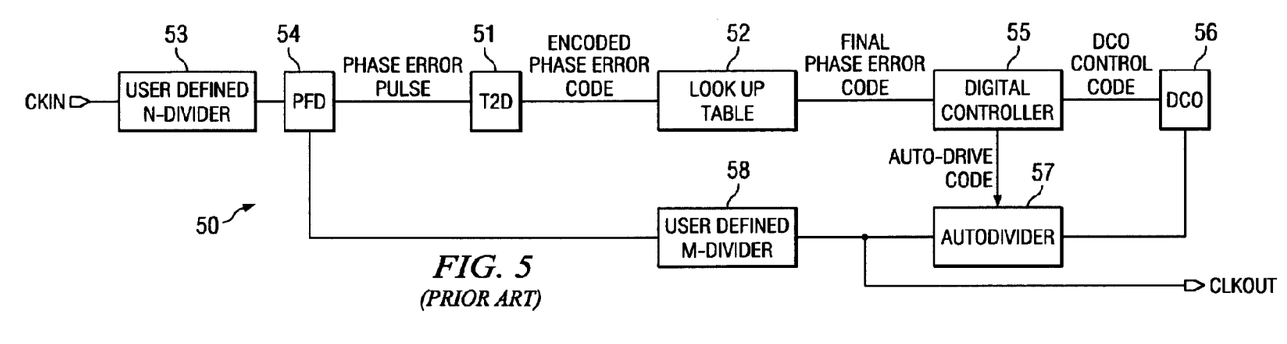
FIG. 5 is block diagram of a prior art variation of a digital PLL, using a time digitizer.

Designers have chosen another variation of the DPLL approach to accommodate requirements such as wide range of input clock frequency, low power supply voltage and wide processing and temperature variations. The DPLL runs entirely in the digital domain, except for the Phase-Frequency-Detector (PFD), the time digitizer (T2D) and Digital-Controlled-Oscillator (DCO). Traditionally, a T2D circuit is used to convert the phase error into digital code. A problem arises when the input clock frequency varies by two orders of magnitude. Then the design of the T2D delay chain becomes more challenging. The T2D must prevent the phase error pulse from saturating the delay chain while occupying a small silicon area as well as maintaining low power consumption. Consequently, a variation of the DPLL has been developed to deal with this problem, which is shown in FIG. 5. This circuit uses a non-linear T2D delay chain 51, along with a corresponding lookup table 52, in addition to the usual input N-Divider 53, PFD 54, Digital Controller 55, DCO 56, Autodivider 57 and feedback M-Divider 58, with the output clock CLKOUT being taken from the output of Autodivider 57. This allows the phase error pulse to be measured and represented in more a meaningful and accurate way.

The circuit shown in FIG. 5 has a phase error resolution limit because of quantization (50 picoseconds) and a spurious signal problem because there is limited or even no filtering of the toggling bits going into the DCO 56. Furthermore, there is intermittent behavior due to adding and subtracting delays that change with input frequency, process and temperature.

Figure 6:
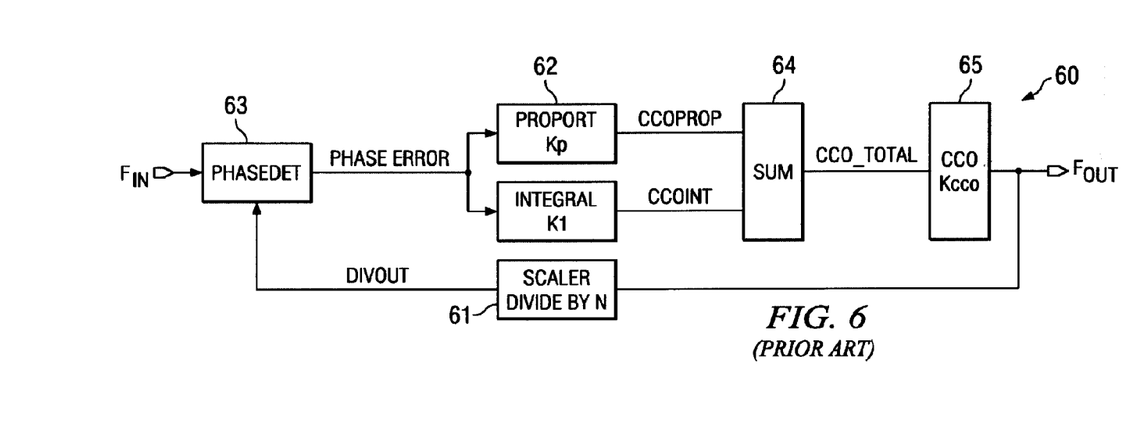
FIG. 6 is a block diagram of a prior art hybrid PLL using a type 2 digital filter and a pulsed analog filter for its loop filter.

FIG. 6 shows a hybrid prior art solution having a loop filter that uses a type 2 digital filter for a coarse tune, but uses a type 1 pulsed analog filter for a fine tune. The coarse tune loop is through an integrator 61 having an integration constant KI, while the fine tune loop is through a proportional analog converter 62 having a proportionality constant KP. The integrator 61 converts a phase error signal from Phase Detector 63 to a current CCOINT corresponding to the integral of the phase error over time. The analog converter 62 converts the phase error signal from Phase Detector 63 to a series of current pulses CCOPROP corresponding proportionally to the phase error. The signals CCOINT and CCOPROP are summed in Summer 64 to generate the sum signal CCO_TOTAL, which is provided to a Current Controlled Oscillator (CCO) 65, the output of which is a signal having a frequency $f_{out}$ and which is the PLL output. The output of CCO 65 is also provided to a Divide by N Scaler 66, the output of which, DIVOUT, is provided as the feedback signal to one input of Phase Detector 63. The other input of Phase Detector 63 is a reference signal having a frequency $f_{in}$. The pulses of the fine tune analog converter 62 cause high jitter and high nose, which makes it undesirable for CODEC and other high performance applications.

Figure 7:
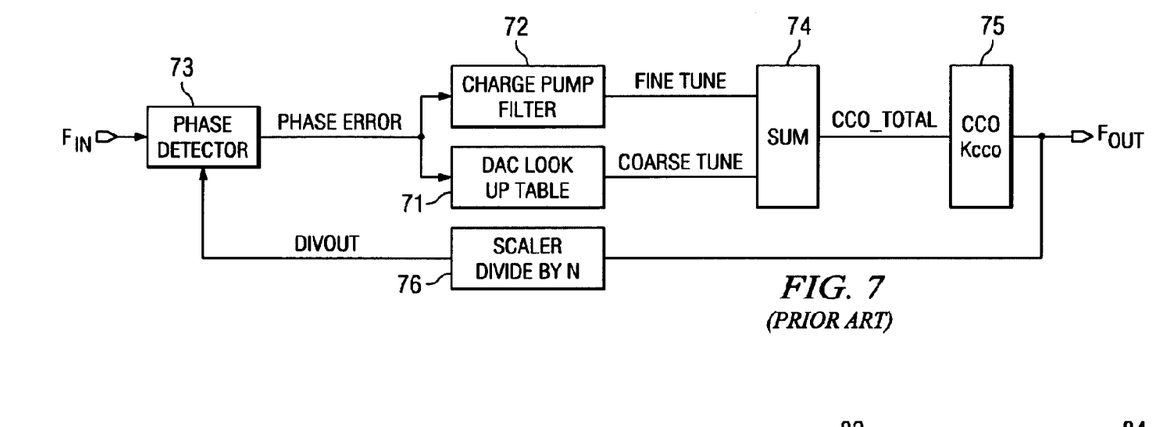
FIG. 7 is a block diagram of a prior art hybrid PLL using a look-up table to do a coarse tune and an analog filter for its loop filter.

FIG. 7 shows a hybrid prior art approach that uses a digital-to-analog converter (DAC) with Look-Up Table 71 to do a coarse tune and an analog filter using a charge pump 72 to do a fine tune, for its loop filter. An Up/Down counter may be used in the place of the Look-Up Table 71. A phase error signal from a Phase Detector 73 is provided to both the DAC/Look-Up Table 71 and Charge Pump Filter 72, with a fine tune signal from the Charge Pump Filter 72 and a coarse tune signal from the DAC/Look-Up Table 71 being provided to respective inputs of a Summer 74, providing a summed output CCO_TOTAL to a CCO 75, the output of which is the PLL output. The output of CCO 75 is also provided to a Divide by N frequency divider 76, the output of which is a signal having a frequency $f_{out}$ and which is provided as the feedback signal to one input of Phase Detector 73. The other input of Phase Detector 73 is a reference signal having a frequency $f_{in}$. In the circuit arrangement of FIG. 7, the analog performance is maintained as long as the DAC does not switch. However, when such a switch occurs, a noise pulse is generated. In addition, a look-up table requires calibration to eliminate process effects and some calculations to minimize temperature and voltage effects. Up and down counting of the DAC also causes glitches and an uncertain response to disturbances such as power brownouts from pulsing the power amplifier, and the like.

SUMMARY OF THE INVENTION

The present invention provides a hybrid digital and analog phase locked loop. A voltage controlled oscillator is provided, having a fine tune input, a coarse tune input and an output. A frequency divider has an input connected to receive a signal provided by the output of the voltage controlled oscillator, and has an output for providing a signal having a frequency that is divided with respect to a signal provided to its input. A phase detector is connected to receive a reference input signal having a reference frequency at a first input thereof and is connected to receive the signal provided by the output of the frequency divider. The phase detector has an output for providing a phase error signal. An analog circuit configured as a proportional filter and is connected to receive the phase error signal and to provide a fine tune signal at the fine tune input of the voltage controlled oscillator. A digital integrator is connected to receive the phase error signal and to provide a coarse tune signal at the coarse tune input of the voltage controlled oscillator.

These and other features of the invention will be apparent to those skilled in the art from the following detailed description of the invention, taken together with the accompanying drawings.

DETAILED DESCRIPTION OF THE PREFERRED EMBODIMENT

The numerous innovative teachings of the present invention will be described with particular reference to the presently preferred exemplary embodiments. However, it should be understood that this class of embodiments provides only a few examples of the many advantageous uses and innovative teachings herein. In general, statements made in the specification of the present application do not necessarily delimit the invention, as set forth in different aspects in the various claims appended hereto. Moreover, some statements may apply to some inventive aspects, but not to others.

Figure 8:
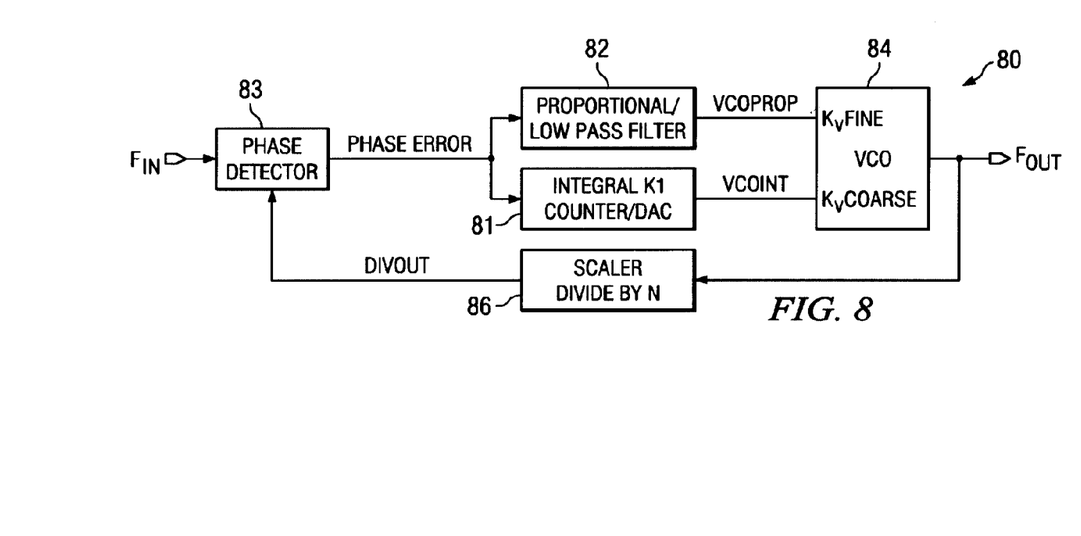
FIG. 8 is a block diagram of a preferred embodiment PLL of the present invention.

FIG. 8 is a block diagram of a preferred embodiment PLL 80 of the present invention. The PLL 80 includes a loop filter consisting of a digital integrator 81 for a coarse tune signal and a proportional/low pass filter 82 for a fine tune signal. Each receives a phase error signal from a phase detector 83, and the digital integrator also receives the PLL 80 output signal at an input thereof. The coarse tune output VCOINT of digital integrator 81 is provided to a coarse tune input of a VCO 84, and the fine tune output VCOPROP of filter 82 is provided to a fine tune input of VCO 84. The output of VCO 84 is the output signal of the PLL 80 and has a frequency $f_{out}=N \times f_{IN}$, of the PLL 80, and is also provided as an input to a divide by N frequency divider 85. The output of frequency divider 85 has a frequency that is 1/N of the frequency provided to its input. The output of frequency divider 85 is provided to one input of phase detector 83, the other input of which is a reference signal having a frequency $f_{in}$. The phase detector 83 compares the divided down VCO output, having a frequency $N \times f_{IN}/N = f_{IN}$, with the reference input clock having a frequency $f_{IN}$, and generates the phase error signal as either an up-count pulse or a down-count pulse, depending on the direction of the phase error, which it provides to the loop filter and to the digital integrator 81.

Figure 9:
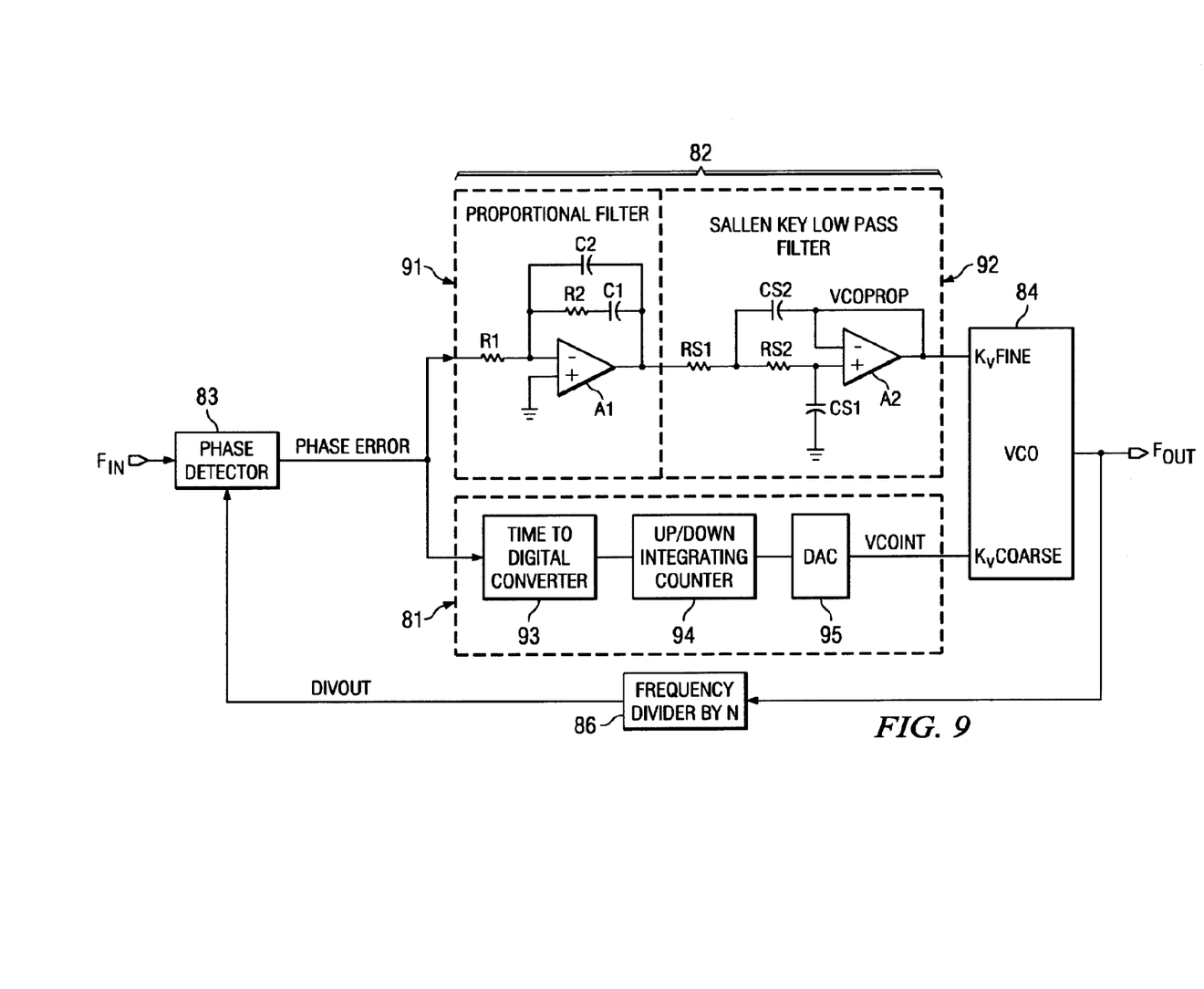
FIG. 9 shows a preferred implementation of the PLL 80 of FIG. 8.

A preferred implementation of the PLL 80 of FIG. 8 is shown in FIG. 9. As shown, the proportional filter 82 is implemented as a two stage arrangement comprising a first stage active compensation circuit, which is in this implementation a proportional filter 91 of conventional design, followed by a low pass filter, which is in this implementation a Sallen-Key low pass filter 92 of known design. Proportional filter 91 comprises resistors R1 and R2, having values R1 and R2, respectively, and capacitors C1 and C2, having values C1 and C2, respectively, arranged with differential amplifier A1, as shown. Sallen-Key filter 92 comprises resistors RS1 and RS2, both having the value RS, and capacitors CS1 and CS2, having values CS1 and CS2, respectively, arranged with differential amplifier A2, as shown. The output of the low-pass filter 92 is provided to the fine input of the VCO 84. The following equations (1) and (2) express damping factor and natural pole frequency of the Sallen-Key filter 92.

$$d = \sqrt{\frac{CS2}{CS1}} \qquad \text{Eq. (1)}$$

$$\omega_n = \frac{1}{RS\sqrt{CS1 \cdot CS2}} \qquad \text{Eq. (2)}$$

where d is the damping factor and $\omega_n$ is the natural pole frequency. Equations (1) and (2) may be used to determine CS1 and CS2, after selecting the damping factor and the value of RS. A description of an exemplary preferred technique for selecting values for the elements of filters 91 and 92 is presented in detail below.

As shown, the digital integrator 81 is implemented as a three stage arrangement comprising a T2D 93, followed by an up/down integrating counter 94, followed by a DAC 95, all of conventional design. The digital integrator 81 counts the number of VCO pulses between the up-count and down-count pulses from the phase detector 83, with an up and down counter and provides that count, positive or negative, to the input of the DAC 95. The output of the DAC 95 is provided to the coarse input of the VCO 84.

At power up, the loop is in wide loop bandwidth mode for, e.g., a few milliseconds, and switches to a narrow loop bandwidth mode after lock. For example, if the input frequency $f_{IN}$ is 32 KHz and the factor N is 512, with a resulting output frequency $f_{OUT}$ of 16.8 MHz, the wide loop bandwidth can be approximately 4 KHz, while the narrow loop bandwidth can be approximately 300 Hz, both depending on the specifics of the implementation.

Figure 10:
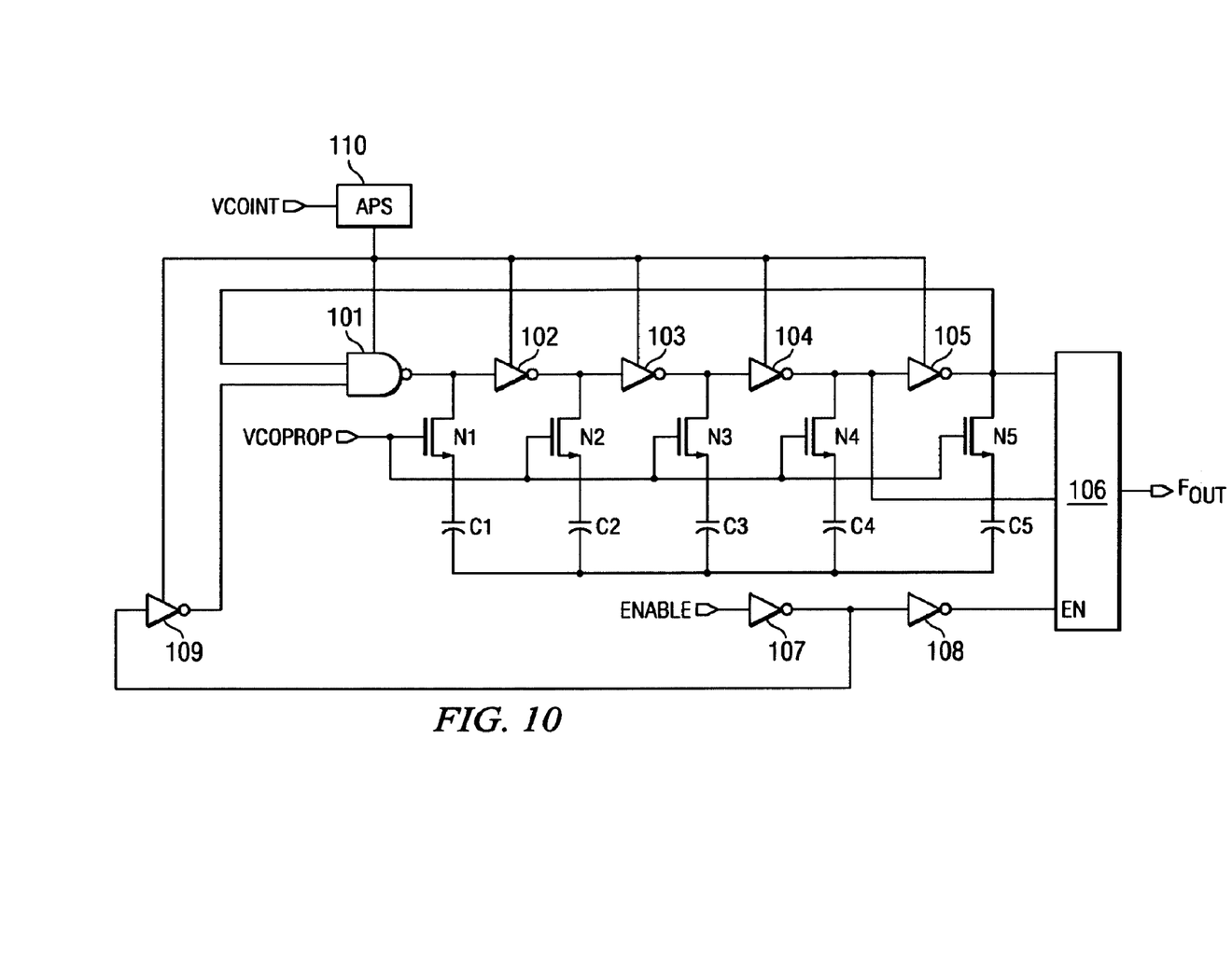
FIG. 10 is a schematic diagram of a preferred implementation of the VCO of the PLL of FIG. 8.

FIG. 10 is a schematic diagram of an exemplary actual VCO 85 of the PLL 80 FIG. 8. The oscillator essentially comprises five inverters in a ring configuration, with the first inverter comprising a NOR gate to allow for an enable/disable function. Thus, the ring oscillator comprises a NAND gate 101 having its output connected to the input of the first of a series connected string of inverters 102, 103, 104, 105. The output of inverter 105 is connected to a first differential input of a level shifter 106, and it is also fed back to one input of NAND gate 101 to complete the ring. An enable signal is provided to the input of an inverter 107. The output of inverter 107 is provided to the input of inverter 108 and the input of an inverter 109. Inverter 108 provides an enable signal to an enable input of level shifter 106, while inverter 109 provides an enable signal to the other input of NAND gate 101, which serves as an enable input of the ring oscillator. Between the respective outputs of NAND gate 101 and of inverters 102–105 and ground is a respective series connected variable resistor and capacitor, N1-C1, N2-C2, N3-C3, N4-C4 and N5-C5, respectively. Each variable resistor is implemented as an NMOS transistor, and the gate of each such NMOS transistor is connected to receive the signal VCOPROP (FIG. 8). The signal VCOINT (FIG. 8) is provided as an input an auxiliary power supply 110. The output of inverter 104 is provided to a second differential input of level shifter 106. The output of level shifter 106 is the output of the VCO 84, having frequency FOUT.

In operation, for the coarse tune, the signal VCOINT controls the level of the supply voltage provided by the auxiliary power supply 110, which supplies power to all of the elements in the ring oscillator, in addition to inverter 109, the output level of which affects the frequency of the ring oscillator. As mentioned above, the signal VCOINT is a digital count of the number of VCO pulses between the up-count and down-count pulses from the phase detector 83. Preferably, the auxiliary power supply is implemented as a digital-to-analog converter (DAC) to convert the signal VCOINT to an analog voltage, followed by a power supply circuit having an output voltage controlled by the output of the DAC. For the fine tune, the output impedance of each inverter is changed by the level of signal VCOPROP adjusting the variable resistance in the respective series connected variable resistor and capacitor.

Figure 11:
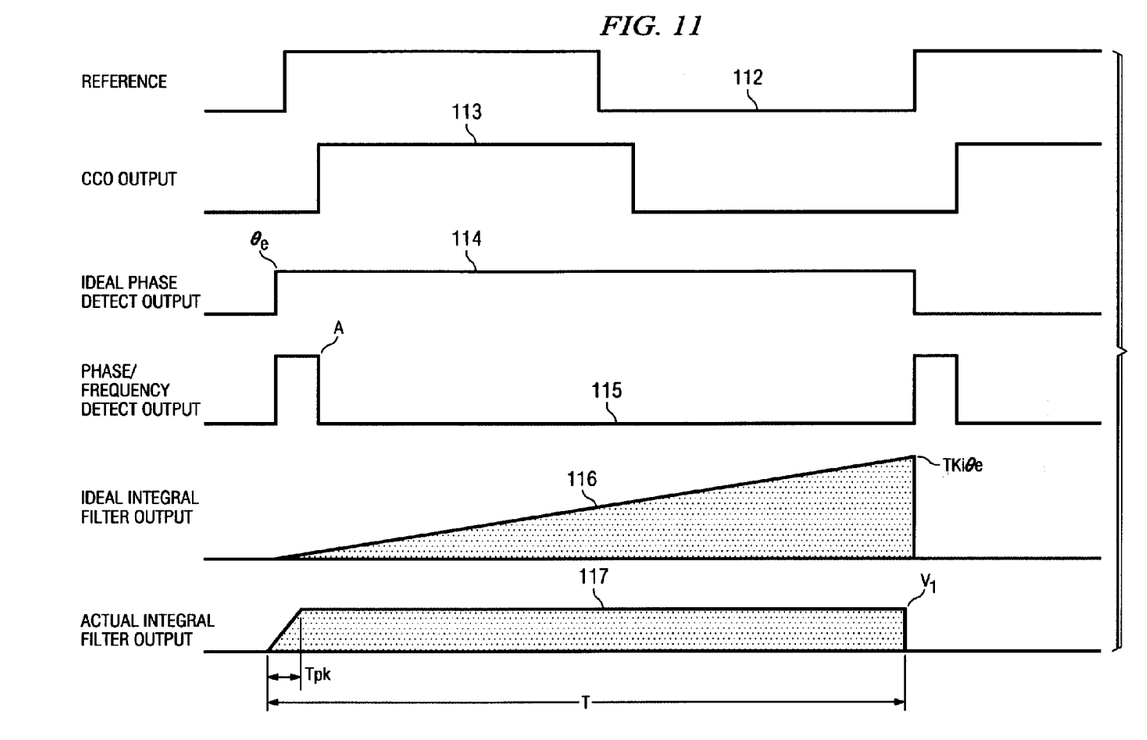
FIG. 11 is a graphic diagram of ideal signals and exemplary actual signals of the PLL of FIG. 8, highlighting the effect of the integral filter 81.

The performance of the proportional and integral filters will now be described in detail to aid in understanding and determining the effects of the proportional and integral gain on the performance of the loop. FIG. 11 is a graph showing wave forms for an ideal integral filter 82 and an exemplary integral filter 81 for the PLL 80 of FIG. 8, wherein the horizontal axis represents time and the vertical axis represents signal level, six graphs being "stacked" on top of one another in order to show relative time alignment. FIG. 11 shows waveforms for the reference clock 112 having frequency of FIN, the output 113 of the VCO, and ideal phase detector output 114, an exemplary phase/frequency detector output 115, and ideal integral filter output 116 and an exemplary integral filter output 117.

In general, the integral filter does course adjustments to output frequency of the loop by controlling a DAC that generates a voltage to change the frequency of the VCO. Wave forms 112 and 113 show a typical phase relationship between the reference input oscillator and the divided down VCO output. Ideally, the duration of the output of the phase detector is proportional to the phase error as shown by the third wave form 114. However, the phase detector output, as shown in the fourth wave form 115, produces a pulse that has a pulse width proportional to phase error. The fifth waveform 116 shows that an ideal integral filter integrates the ideal phase detector output for the full period, which produces a ramped voltage output to (T $K_i$ $\theta_e$) for the ideal integral filter. However, the exemplary PLL integrates only for the pulse width ($T_{pk}$) of the output of the phase detector, and then holds that value until the next period (T). The output voltage $V_I$ is determined by the number of clock pulses inside the phase detector output pulse times the LSB size of the voltage DAC.

For example, given a 2.5 V supply, 32.768 kHz reference frequency, a feedback divide ratio of 512, and 8 bit DAC with a 0.01 V LSB, and using the VCO clock to count the pulse size $t_{pk}$ produces 128 clock pulses in $2\pi$ of the input period. Multiplying the clock to count applied a 0.01 V LSB size (2.56V/256LSB=0.01V/LSB) gives 1.28 V in $2\pi$. To equate at the actual circuit with the ideal and normalize to $2\pi$, the 1.28 V is divided by $2\pi$ and the input. T to produce the integral gain slope of 0.2 V/rad-s. Multiplying the integral gain by the input period and the phase error in radians produces the output voltage of the integral filter for the next period.

Figure 12:
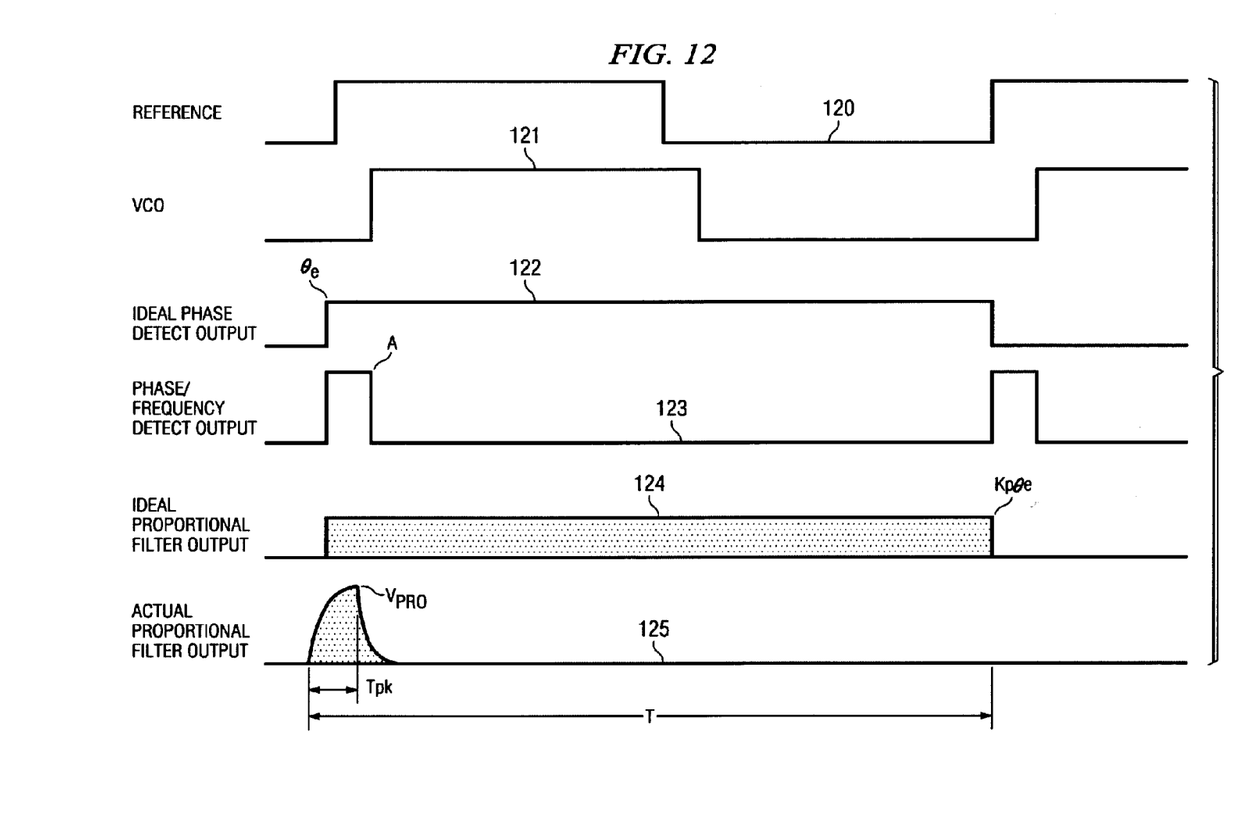
FIG. 12 is a graphic diagram of ideal signals and exemplary actual signals of the PLL of FIG. 8, highlighting the effect of the proportional filter 82.

FIG. 12 is a graph showing wave forms for an ideal proportional filter 81 and an exemplary PLL proportional/low pass filter 82 for the PLL 80 of FIG. 8, wherein, as in FIG. 11, the horizontal axis represents time and the vertical axis represents signal level, six graphs being "stacked" on top of one another in order to show relative time alignment. FIG. 12 shows waveforms for the reference clock 120, having frequency of FIN, the output 121 of the VCO, an ideal phase detector output 122, an exemplary phase/frequency detector output 123, an ideal proportional filter output 124 and an exemplary proportional filter output 125. The proportional filter makes fine adjustments to the loop's output frequency. It can be seen that the top four wave forms 120, 121, 122, 123, are the same as in FIG. 11. The last waveform 125 shows the voltage output of the proportional filter for the exemplary PLL, which may be RC filtered to minimize the jitter of the VCO. The RC filter reduces jitter by reducing the peak for small phase errors and spreading the change in phase over a longer reference time period. The area of the waveform is used to compute the adjustment of the phase to the loop ($K_p$ $\theta_e$ T≈$V_{pro}$ $T_{pk}$) ($V_{pk}$ R2/R1=$V_{pro}$), where $K_p$ is the proportional gain, i.e. A/rad, $V_{pro}$ is the maximum voltage of the output V of the proportional filter, which equals $V_{pk}$·(R2/R1), $V_{pk}$ is equal to the supply voltage, T is the time period of the reference frequency in seconds, R1 and R2 are as described above in conjunction with FIG. 9, $\theta_e$ is the phase error output of the phase detector, and $T_{pk}$ is the time interval from the positive edge of the reference input to the peak voltage of the proportional filter waveform. Since $T_{pk}=\theta_e/\omega_i$, where $\omega_i$ is the input reference frequency in rad/sec, which equals $2\pi$ 1/T, then by substitution $K_p$ equals ($V_{pro}/2\pi$ in V/rad). $K_p$ also equals the phase detector slope after the charge pump. The average voltage of the waveform is used to compute the frequency change ($V_{pro}$ $T_{pk}/T$). For example, a peak phase detector output voltage of 1 V with R2=R1, (1V R2/R1=1) reference frequency of 32 KHz, and a phase detector output pulse width of 0.5 μs produces a proportional gain of 0.159 V/rad-s, a phase change of 5E-7 rad, and an average output voltage of 0.016 V.

By making the exemplary PLL equation equivalent to the charge pump equation the exemplary solutions may be related back to the more familiar charge pump equation. Equation (3) shows the charge pump equation:

$$\theta_e(n+1) = \theta_e(n) + \frac{\Delta\Omega \cdot 2 \cdot \pi}{\omega_i} - \frac{K_v \cdot I_p \cdot \theta_e(n)}{\omega_i} \cdot \left(R_2 + \frac{2 \cdot \pi}{C \cdot \omega_i}\right) - \frac{K_v \cdot 2 \cdot \pi}{\omega_i} \cdot \left(\sum_{m=0}^{n+1} \frac{I_p}{C \cdot \omega_i} \cdot \theta_e(m)\right) \qquad \text{Eq. (3)}$$

In equation (3), the first term to the right of the equal sign $\theta_e(n)$ is the previous error. The second term $$\frac{\Delta\Omega \cdot 2 \cdot \pi}{\omega_i}$$

is the normalized offset frequency for the VCO (output frequency with 0 V on the control line) minus the reference frequency. The third term $$\frac{K_v \cdot I_p \cdot \theta_e(n)}{\omega_i} \cdot \left(R_2 + \frac{2 \cdot \pi}{C \cdot \omega_i}\right)$$

is a normalized proportional response to the phase error. The fourth term $$\frac{K_v \cdot 2 \cdot \pi}{\omega_i} \cdot \left(\sum_{m=0}^{n+1} \frac{I_p}{C \cdot \omega_i} \cdot \theta_e(m)\right)$$

is a normalized integral response to the phase error, which is a summation.

Rearranging the derivation of the difference equation for the exemplary PLL yields Equation (4), which has a digital integrator part and an analog proportional part. Equation (4) is a clear difference equation.

$$\theta_e(n+1) = \theta_e(n) + \frac{2 \cdot \pi \cdot (\omega_i - \omega_b)}{\omega_i} - \qquad \text{Eq. (4)}$$

$$K_{cco} \cdot \theta_e(n) \cdot \frac{K_p}{f_i} - \frac{2 \cdot \pi \cdot K_{cco}}{\omega_i} \cdot \sum_{m=0}^{n+1} \frac{K_i}{f_i} \cdot \theta_e(m)$$

where:
$K_p$=Proportional gain (A/rad),
$K_i$=Integral gain (A/rad-sec), and
$K_{cco}$=Gain of current controlled oscillator (rad/s/A).

The following equations were derived by comparing Equation (4) with Equation (3). These equations relate charge pump variables to the integral and proportional filter parameters in the exemplary PLL.

$$K_i = I_p/(2\pi C) \qquad \text{Eq. (5)}$$

The integral gain measures the phase error output signal from the phase detector with a clock divided down from the output of the current controlled oscillator. The number of clocks counted control a DAC that provides a current to the current controlled oscillator. Equation (6) illustrates how the integral gain is computed in terms of the exemplary PLL circuit parameters.

$$K_i = \frac{V_{step} \cdot N_{pdclk}}{2 \cdot \pi \cdot \left(\frac{1}{f_i}\right)} \qquad \text{Eq. (6)}$$

To make the exemplary PLL parameters equivalent to the charge pump PLL parameters, set $I_p = V_{step} \cdot N_{pdclk}$ (for example, 128·0.01=1.28) and $C=1/f_i$ (for example, 1/32 kHz=32 μF).

Equating the difference equations between analog and digital shows the power of the digital integrator which is equivalent to an analog 32 μF capacitor. Consequently, the digital integrator has allowed us to integrate a huge analog capacitor occupying 8E9 μM² of IC Silicon area into a much smaller area, 4E4 μM². This is a 2E5 area reduction.

Figure 13:
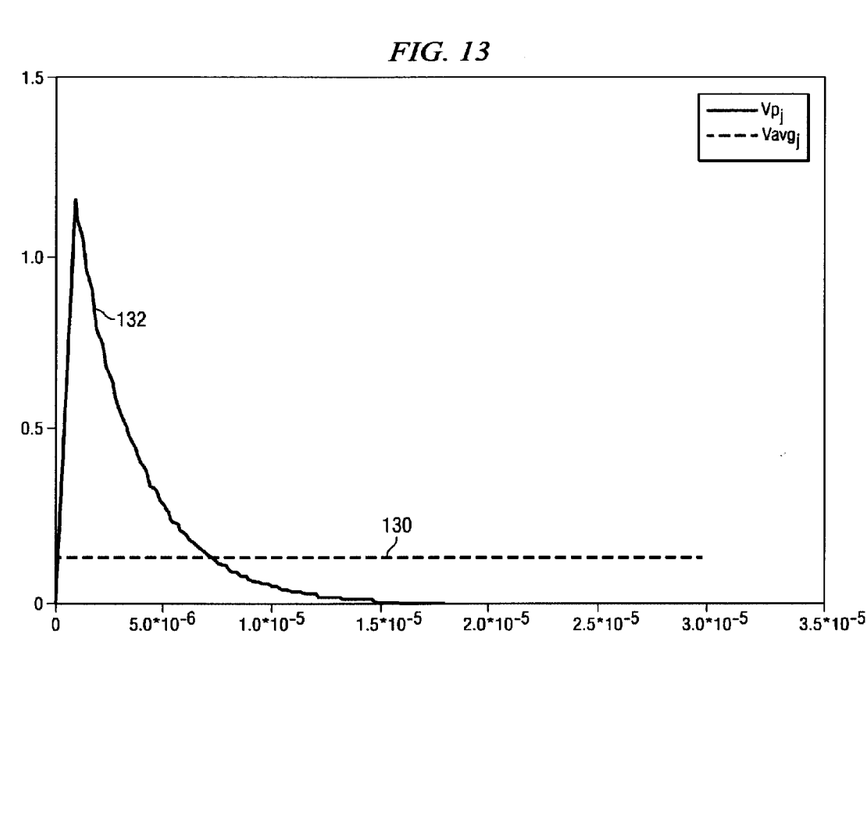
FIG. 13 is a graphic diagram showing the voltage waveform of the output of an exemplary proportional filter 82 without a low pass filter of the PLL of FIG. 8.

The proportional filter produces an RC shaped voltage pulse from the output pulse of the phase detector. FIG. 13 is a graph showing the voltage waveform 132 that is produced from a 500 ns pulse out of an exemplary proportional filter 91 of FIG. 9, i.e., the input to low pass filter 92. The average voltage of the waveform, shown by dashed line 130, is also shown in figure. The average voltage corresponds to the change in frequency that the waveform produces at the output of the voltage controlled oscillator.

The following equation (7) for the proportional gain in terms of charge pump parameters, with $C=1/f_i$, was derived by comparing Equations (3) and (4).

$$K_p = \frac{I_p}{2 \cdot \pi} \cdot (R2 + 1) \qquad \text{Eq. (7)}$$

Equation (8) shows the proportional gain in terms of the exemplary PLL parameters.

$$K_p = \frac{V_{pro}}{2 \cdot \pi} \qquad \text{Eq. (8)}$$

where:

$V_{pro}$ = maximum voltage of output of proportional filter (V)

= $V_{pk} R_2 / R_1$, and $V_{pk}$ = supply voltage.

Equation (9) is derived by setting $R_2=1$ and $V_{pro}=I_p/2$, and shows the proportional gain in terms of the charge pump PLL.

$$K_p = \frac{I_p}{2 \cdot \pi}(2) \qquad \text{Eq. (9)}$$

Equation (10) expresses $K_{ip}$ in terms of a ratio of integral and proportional gain voltage, so that one $I_p$ variable can be used.

$$K_{ip} = \frac{V_{step} \cdot N_{pdclk}}{V_{pro}} \qquad \text{Eq. (10)}$$

For example, an integral gain voltage of 1.28 and a proportional gain voltage of 1 produces a ratio of 1.28 (1.28/1). From Equation (10), Equation (6) can now be rewritten in terms of $I_{pro}$, as shown in Equation (11).

$$K_i = \frac{V_{pro} \cdot K_{ip}}{2 \cdot \pi \cdot \left(\frac{1}{f_i}\right)} \qquad \text{Eq. (11)}$$

Equation (12) shows the exemplary PLL difference equations in terms of equivalent charge pump PLL terms, with $C=1/f_i$, $I_p=V_{pro}/2$ and $R_2=1$.

$$\theta_e(n+1) = \theta_e(n) + \frac{2 \cdot \pi \cdot \Delta\Omega}{\omega_i} - \frac{K_v}{K_{vratio}} \cdot \theta_e(n) \cdot \frac{I_p}{\omega_i} \cdot (2) - \frac{2 \cdot \pi \cdot K_v}{\omega_i} \cdot \sum_{m=0}^{n+1} \theta_e(n) \cdot \frac{I_p \cdot K_{ip}}{\omega_i \cdot C} \qquad \text{Eq. (12)}$$

In the following Equations (13) and (14), exemplary PLL integral and proportional parameters are related to the servo terminology for a transfer function with natural frequency and damping factors.

$$\omega_n := \sqrt{\frac{K_v}{N_{div}} \cdot K_i} \qquad \text{Eq. (13)}$$

$$\zeta := \frac{\frac{K_p}{K_{vratio}} \cdot \omega_n}{2 \cdot K_i} \qquad \text{Eq. (14)}$$

Given a $K_v$ of 10 MHz/V and a $K_{vratio}$ of 30, Equations (13) and (14) can be used to compute a natural frequency of 4.5 kHz and a damping factor ratio of 0.28 in this example.

Although the present invention and its advantages have been described in detail, it should be understood that various changes, substitutions and alterations can be made herein without departing from the spirit and scope of the invention as defined by the appended claims.

What is claimed is:

1. A hybrid digital and analog phase locked loop, comprising:

a voltage controlled oscillator having a fine tune input, a coarse tune input and an output;

a frequency divider having an input connected to receive a signal provided by the output of the voltage controlled oscillator, and having an output for providing a signal having a frequency that is scaled with respect to a signal provided to its input;

a phase detector connected to receive a reference input signal having a reference frequency at a first input thereof and connected to receive the a signal provided by the output of the frequency divider, and having an output for providing a phase error signal;

an analog circuit configured as a proportional filter connected to receive the phase error signal and to provide a fine tune signal at the fine tune input of the voltage controlled oscillator; and a digital integrator connected to receive the phase error signal and to provide a coarse tune signal at the coarse tune input of the voltage controlled oscillator.

2. A hybrid digital and analog phase locked loop as in claim 1 wherein the analog circuit is configured as a two stage proportional filter, comprising:

a first stage active compensation circuit; and a second stage low pass filter.

3. A hybrid digital and analog phase locked loop as in claim 1 wherein the second stage low pass filter comprises a Sallen-Key filter.

4. A hybrid digital and analog phase locked loop as in claim 1, wherein:

the phase detector compares the output signal of the frequency divider with the reference input signal, and generates the phase error signal as either an up-count pulse or a down-count pulse, depending on the direction of the phase error; and the digital integrator is connected to receive the signal at the output of the voltage controlled oscillator, counts in the number of voltage controlled oscillator pulses between the up-count and down-count pulses from the phase detector, with an up and down counter, and provides that count, positive or negative, to the coarse tune input of the voltage controlled oscillator.

* * * * *